United States Patent
Kashiwagi et al.

(10) Patent No.: US 8,164,202 B2
(45) Date of Patent: Apr. 24, 2012

(54) OPTICAL SEMICONDUCTOR DEVICE ENCAPSULATED WITH SILICONE RESIN

(75) Inventors: Tsutomu Kashiwagi, Annaka (JP); Takahiro Hongo, Tokushima (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 123 days.

(21) Appl. No.: 12/710,593

(22) Filed: Feb. 23, 2010

(65) Prior Publication Data
US 2010/0213502 A1    Aug. 26, 2010

(30) Foreign Application Priority Data
Feb. 24, 2009   (JP) ................. 2009-041246

(51) Int. Cl.
*H01L 23/29* (2006.01)
(52) U.S. Cl. .......... 257/791; 257/103; 257/100; 257/98; 257/432
(58) Field of Classification Search ............ 257/100, 257/79, 88, 99, 103, 432, 98, 791
See application file for complete search history.

(56) References Cited

U.S. PATENT DOCUMENTS

| 4,125,510 | A | 11/1978 | Antonen |
| 6,184,407 | B1 * | 2/2001 | Yoshitake et al. ............ 556/434 |
| 2004/0214966 | A1 | 10/2004 | Tabei et al. |
| 2005/0244649 | A1 | 11/2005 | Kashiwagi et al. |
| 2009/0045422 | A1 * | 2/2009 | Kato et al. ................... 257/98 |

FOREIGN PATENT DOCUMENTS

| JP | 2005-76003 A | 3/2005 |
| WO | WO 2005/033207 A1 | 4/2005 |
| WO | WO 2007/100445 A2 | 7/2007 |

* cited by examiner

*Primary Examiner* — Ha Tran T Nguyen
*Assistant Examiner* — Thanh Y Tran
(74) *Attorney, Agent, or Firm* — Birch, Stewart, Kolasch & Birch, LLP (57) ABSTRACT

An optical semiconductor device encapsulated with a silicone resin that suffers no discoloration of the lead and exhibits excellent thermal shock resistance. The optical semiconductor device includes an optical semiconductor element and a cured product of a silicone resin composition that encapsulates the optical semiconductor element, wherein the amount of $(\Phi SiO_{3/2})$ units (wherein $\Phi$ represents a phenyl group) within the cured product, determined by solid $^{29}$Si-DD/MAS analysis, is within a range from 0.13 mol/100 g to 0.37 mol/100 g.

4 Claims, 3 Drawing Sheets

OPTICAL SEMICONDUCTOR DEVICE ENCAPSULATED WITH SILICONE RESIN

BACKGROUND OF THE INVENTION

1. Field of the Invention

The present invention relates to an optical semiconductor device, and particularly a light emitting diode (LED) device, having an optical semiconductor element encapsulated within a cured product of a silicone resin. Specifically, the invention relates to an optical semiconductor device which, as a result of incorporating a predetermined amount of ($\Phi SiO_{3/2}$) units (wherein $\Phi$ represents a phenyl group) within the encapsulating silicone resin cured product, suffers no discoloration at the lead surface, and exhibits excellent thermal shock resistance.

2. Description of the Prior Art

Optical semiconductor devices comprise an optical semiconductor element that is mounted on a lead formed of silver or a silver-containing alloy, or formed of a base material of iron, copper or the like and a silver plating layer covering the base material, with an adhesive such as a die bonding agent disposed therebetween. A silicone resin composition, and particularly an addition-curable silicone rubber composition, which is capable of forming a cured product that exhibits excellent rubber-like properties such as weather resistance, heat resistance, hardness and elongation, is typically used as a coating material or encapsulating material for protecting the optical semiconductor element from the external environment (see Patent Documents 1 and 2). However, in recent years, discoloration of the lead caused by corrosive gases within the environment penetrating through the encapsulating material has become a significant problem.

Silicone resins generally exhibit a high level of gas permeability. Accordingly, potential methods of addressing the discoloration problem described above include replacing the silicone resin with an epoxy resin having a lower level of gas permeability, or using a harder silicone resin. However, the cured products of these types of resins are hard and prone to cracking, and suffer from a concomitant loss in thermal shock resistance.

[Patent Document 1] US 2004/0214966 A1
[Patent Document 2] JP 2005-76003 A

SUMMARY OF THE INVENTION

An object of the present invention is to provide an optical semiconductor device encapsulated with a silicone resin that suffers no discoloration of the lead and exhibits excellent thermal shock resistance.

As a result of intensive investigation aimed at achieving the above object, the inventors of the present invention discovered that by incorporating a predetermined amount of ($\Phi SiO_{3/2}$) units (wherein $\Phi$ represents a phenyl group) within the encapsulating silicone resin cured product, the above object could be achieved. In other words, the present invention provides an optical semiconductor device comprising an optical semiconductor element and a cured product of a silicone resin composition that encapsulates the optical semiconductor element, wherein the amount of ($\Phi SiO_{3/2}$) units (wherein $\Phi$ represents a phenyl group) within the cured product, determined by solid $^{29}$Si-DD/MAS analysis, is within a range from 0.13 mol/100 g to 0.37 mol/100 g.

The optical semiconductor device of the present invention is encapsulated with a cured product comprising a predetermined amount of ($\Phi SiO_{3/2}$) units, and therefore not only is discoloration of the lead prevented, but the thermal shock resistance is also excellent.

DETAILED DESCRIPTION OF THE PREFERRED EMBODIMENTS

Figure 1:
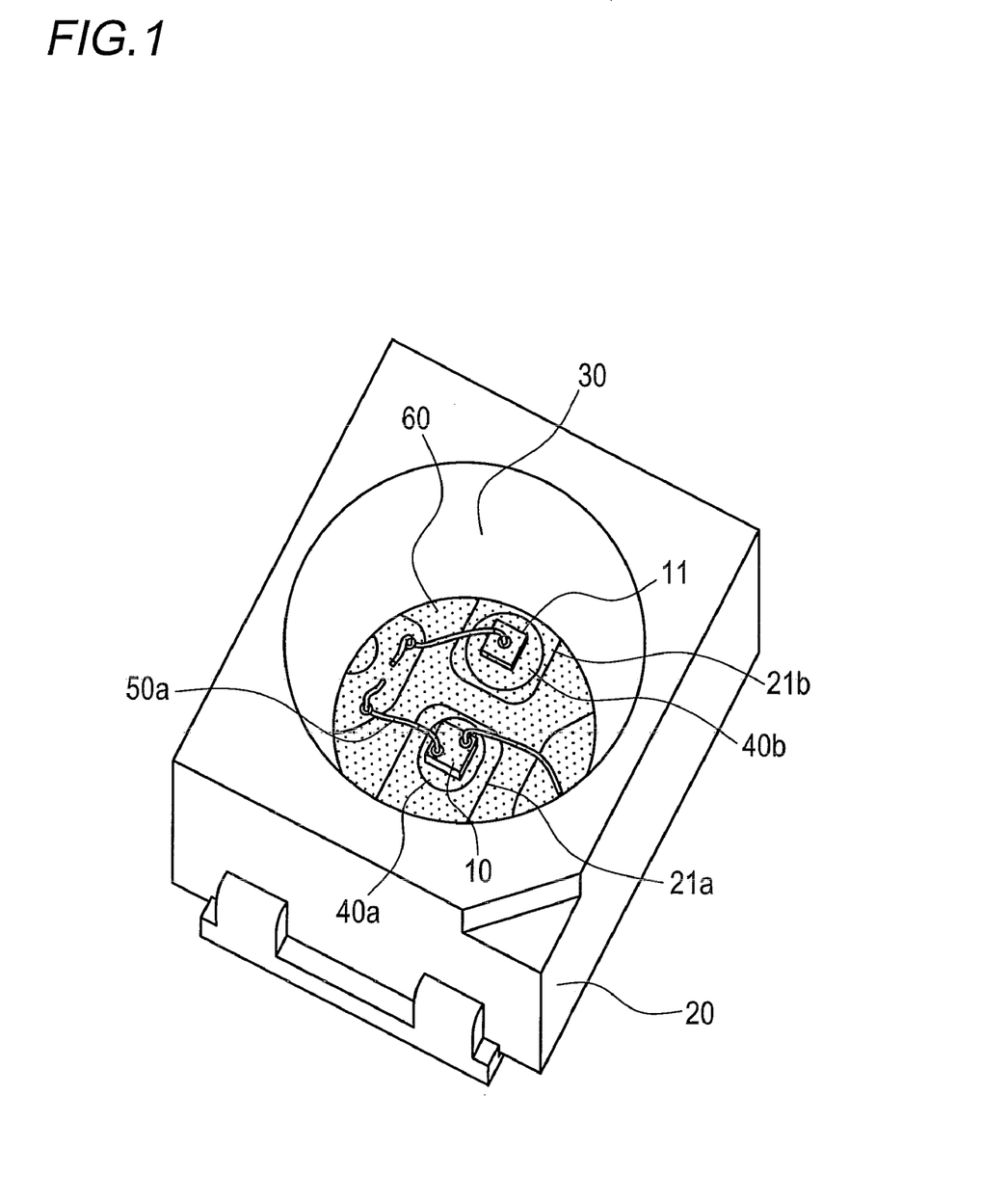
FIG. 1 is a schematic perspective view illustrating one example of an optical semiconductor device.
Figure 2:
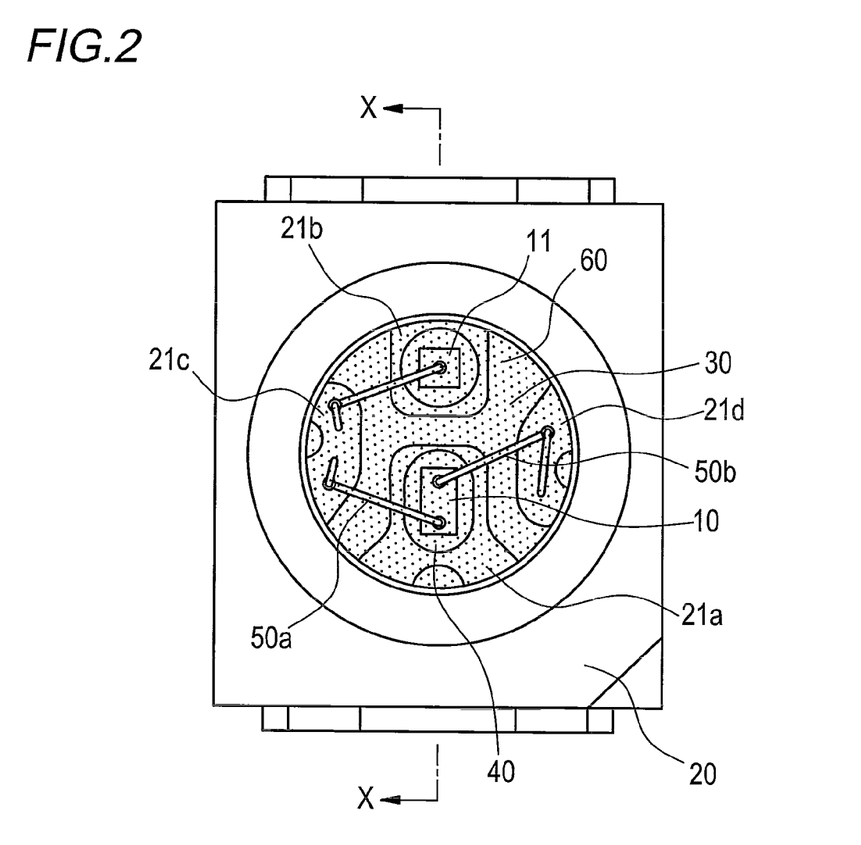
FIG. 2 is a schematic plane view illustrating one example of an optical semiconductor device.
Figure 3:
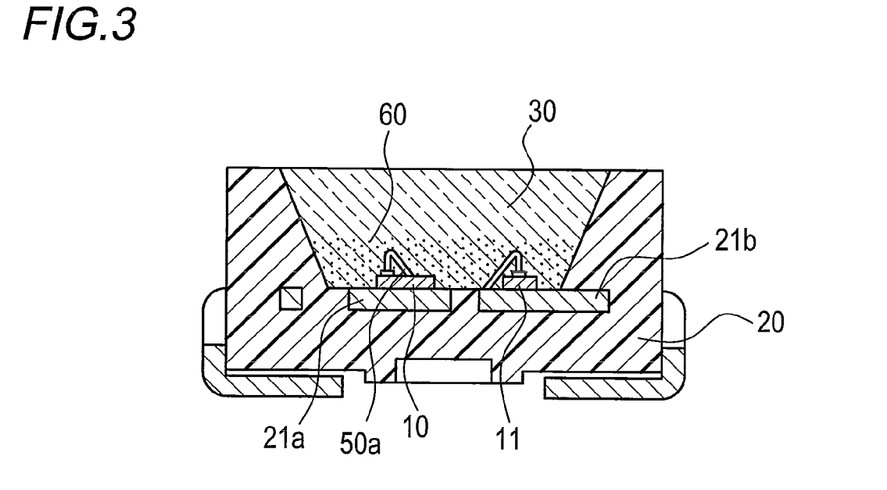
FIG. 3 is a schematic cross-sectional view illustrating one example of an optical semiconductor device.

An example of an optical semiconductor device of the present invention is described below with reference to the drawings. FIG. 1 is a schematic perspective view illustrating one example of an optical semiconductor device, and FIG. 2 is a schematic plane view of the device. FIG. 3 is a schematic cross-sectional view along the line X-X of the optical semiconductor device illustrated in FIG. 2. The optical semiconductor device comprises an optical semiconductor element 10, a package 20 inside which the optical semiconductor element 10 is mounted, and an encapsulating member 30 that covers the optical semiconductor element 10. The package 20 has conductive leads 21 (specifically, four leads 21a, 21b, 21c and 21d). The package 20 has a cup-shaped depression having a bottom surface and a side surface, and the surfaces of the leads 21 are exposed at the bottom surface of the depression. The leads 21 are formed of silver or a silver-containing alloy or a base material such as iron or copper with a surface plated with silver. The optical semiconductor element 10 is connected to lead 21a via a die bonding member 40 (not shown in FIG. 3 because of being a thin layer), is connected to another lead 21c via a wire 50a, and is connected to lead 21d via a wire 50b. A protective element 11 such as a zener may be mounted on another lead 21b. An encapsulating member 30 containing a predetermined amount of ($\Phi SiO_{3/2}$) units (wherein $\Phi$ represents a phenyl group) is used to fill the cup-shaped depression. The encapsulating member 30 may also comprise a fluorescent material 60 that absorbs the light from the optical semiconductor element 10 and alters the wavelength.

Examples of the optical semiconductor element 10 include blue light-emitting LED chips formed from a gallium nitride (GaN) based semiconductor, ultraviolet light-emitting LED chips, and laser diodes and the like. In addition, elements prepared by using a MOCVD method or the like to form a light emitting layer of a nitride semiconductor such as InN, AlN, InGaN, AlGaN or InGaAlN on top of a substrate may also be used. Either a face-up mounted optical semiconductor element or a flip-chip mounted optical semiconductor element may be used. Furthermore, the optical semiconductor element 10 illustrated in FIG. 1 to FIG. 3 represents an example of an optical semiconductor element in which the n-side electrode and the p-side electrode are disposed on the same surface, but optical semiconductor elements in which the n-side electrode is provided on one surface and the p-side electrode is provided on the opposing surface can also be used.

Packages in which the leads 21 are integrally molded as part of the package, and packages in which the package is first molded, and plating or the like is then used to provide leads 21 as circuit wiring on the package can both be used. The shape of the bottom of the depression within the package 20 can adopt a multitude of shapes including a flat plate shape. The resin that constitutes the package is preferably an electrically insulating resin with excellent light resistance and heat resistance, and examples of resins that may be used include thermoplastic resins such as polyphthalamide resins, thermosetting resins such as epoxy resins, as well as glass epoxy resins and ceramics. Further, in order to ensure efficient reflection of light from the optical semiconductor element 10, a white pigment such as titanium oxide may be mixed into these resins. Examples of methods that may be used for molding the package include insert molding in which the leads are positioned inside the molding die prior to molding, injection molding, extrusion molding and transfer molding.

The leads 21 are connected electrically to the optical semiconductor element, and, for example, may be plate-shaped leads that are inserted within the package, or a conductive pattern that is formed on a substrate of a glass epoxy resin or ceramic. The material used for forming the leads may be silver or a silver-containing alloy, or alternatively, a lead composed mainly of copper or iron may be partially plated with either silver or a silver-containing alloy.

The encapsulating member 30 may comprise a fluorescent material or a light diffusion material. The fluorescent material may be any material that absorbs the light emitted from the optical semiconductor element and emits fluorescence, thereby altering the wavelength of the light, and at least one material selected from amongst nitride-based phosphors or oxynitride-based phosphors activated mainly with lanthanoid elements such as Eu or Ce, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors and germanate phosphors activated mainly with lanthanoid elements such as Eu or transition metal elements such as Mn, rare earth aluminate phosphors and rare earth silicate phosphors activated mainly with lanthanoid elements such as Ce, and organic or organic complex phosphors activated mainly with lanthanoid elements such as Eu is preferred. Moreover specific examples of fluorescent materials that may be used favorably include $(Y,Gd)_3(Al,Ga)_5O_{12}:Ce$, $(Ca,Sr,Ba)_2SiO_4:Eu$, $(Ca,Sr)_2Si_5N_8:Eu$, and $CaAlSiN_3:Eu$.

The encapsulating member 30 has the functions of efficiently transmitting the light from the optical semiconductor element 10 into the external environment, as well as protecting the optical semiconductor element and the wires and the like from dust and the like. In addition to these functions, the encapsulating member 30 in the present invention also prevents the penetration of corrosive gases into the device. This prevents the silver of the leads from corroding and causing a deterioration in the light reflection efficiency. The encapsulating member consists of a cured product of a silicone resin composition, and the amount of $(\Phi SiO_{3/2})$ units (wherein $\Phi$ represents a phenyl group) within the cured product, determined by solid $^{29}Si$-DD/MAS analysis, is within a range from 0.13 mol/100 g to 0.37 mol/100 g, and preferably from 0.17 mol/100 g to 0.25 mol/100 g. If the amount of these $(\Phi SiO_{3/2})$ units (hereafter referred to as "T-$\Phi$ units") is less than the lower limit of the above range, then the effect of the invention in inhibiting discoloration of the leads tends to be inadequate, whereas if the amount exceeds the upper limit of the above range, then the thermal shock resistance tends to deteriorate.

In the present invention, the T-$\Phi$ unit amount (mol/100 g) was determined as set out below.

Figure 4:
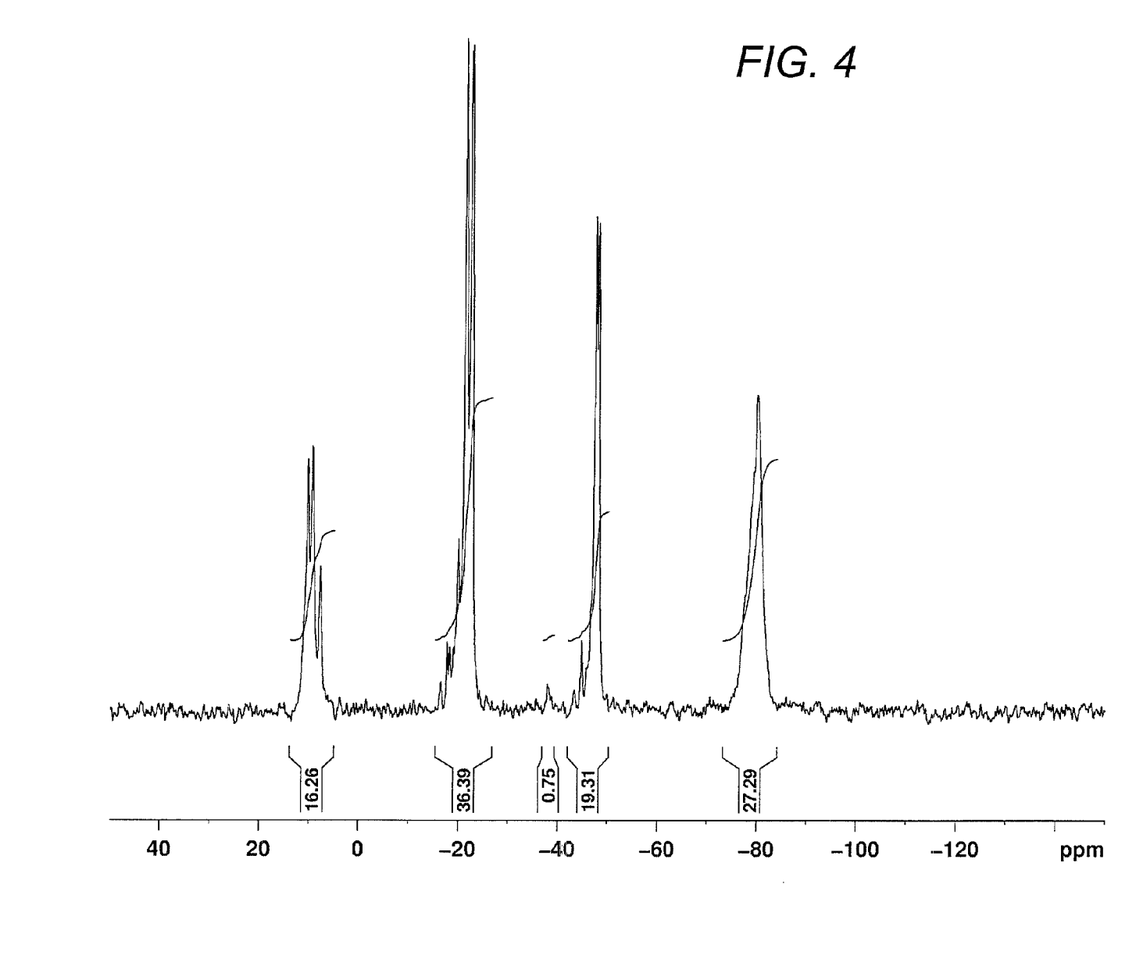
FIG. 4 is an example of a solid $^{29}$Si-DD/MAS NMR spectral chart.

The solid $^{29}Si$-DD/MAS (Dipolar Decoupling/Magic Angle Spinning) analysis was measured using a nuclear magnetic resonance apparatus (AVANCE 700, manufactured by Bruker Corporation), by packing a solid sample (a cured silicone product) of approximately 100 mg inside a rotor made of zirconia and having an external diameter of 4 mm, subsequently rotating the sample at 9,000 Hz while irradiating 30 degree pulses at intervals of 30 seconds, and accumulating the results of approximately 1,000 repetitions. An example of the type of obtained $^{29}Si$-DD/MAS spectrum is illustrated in FIG. 4. From a $^{29}Si$-DD/MAS spectrum thus obtained, the proportion of silicon atoms contained in each of all the types of siloxane units constituting the sample was calculated in mol %. This proportion of the silicon atoms are the same as the proportion (in mol %) of that type of siloxane unit. In the same way, the proportions in mol % of all the types of siloxane units were obtained. The proportion on a mass basis of each type of siloxane unit was obtained by multiplying the mol % of each type of siloxane unit by the unit formula weight for that particular siloxane unit type (for example, in the case of the T-$\Phi$ unit, a unit formula weight of 130 (=29+77+16×3/2)). Subsequently, the T-$\Phi$ unit amount (mol/100 g) was calculated by dividing the value for the mol % of the T-$\Phi$ unit by the sum of the values on a mass basis for the proportions of all the types of siloxane units, and then multiplying the thus calculated value by 100. As illustrated below in Table 1, when the values for the amount of T-$\Phi$ units within four known cured products were measured, the results of the measurements were confirmed as being substantially the same as the theoretical amounts calculated from the concentrations of the starting silane compounds.

TABLE 1

| Sample number | T-$\Phi$ unit theoretical amount (mol/100 g) | T-$\Phi$ Si atoms (mol %) | T-$\Phi$ unit measured amount (mol/100 g) |
|---|---|---|---|
| 1 | 0.240 | 27.3 | 0.238 |
| 2 | 0.255 | 28.6 | 0.248 |
| 3 | 0.269 | 32.4 | 0.273 |
| 4 | 0.268 | 32.4 | 0.271 |

A T-$\Phi$ unit amount within the range specified in the present invention can be realized by using a composition comprising components (A), (B) and (C) described below. Each of these components is described below.

The component (A) is composed of:

(A-1) an aliphatic unsaturated group-containing silicone resin represented by an average composition formula (1) shown below:

$$R_a^1 R_b^2 R_c^3 (OX)_d SiO_{(4-a-b-c-d)/2} \quad (1)$$

(wherein each $R^1$ independently represents a methyl group, an ethyl group, a propyl group or a cyclohexyl group, and is preferably a methyl group, $R^2$ represents a phenyl group, $R^3$ represents an aliphatic unsaturated group, X represents a hydrogen atom or an alkyl group of 1 to 6 carbon atoms, provided the OX group is bonded to the silicon atom via the oxygen atom, a represents a number from 0.4 to 1.6, b represents a number from 1.6 to 3.6, c represents a number from 0.4 to 0.8, and d represents a number from 0 to 0.05, provided that $0<a+b+c+d<4$), and (A-2) a linear organopolysiloxane having an aliphatic unsaturated group at both terminals and having a viscosity at 25° C. within a range from 10 to 500,000 mPa·s, represented by a formula (2) shown below:

(wherein $R^4$ and $R^5$ each independently represents a methyl group, ethyl group, propyl group, cyclohexyl group or phenyl group, $R^6$ represents a vinyl group or allyl group, k and l each represents an integer of 0 to 1,000, provided that k+l is within a range from 10 to 1,000 and (1/k+l)≦0.5, and x represents an integer of 1 to 3).

In the formula (1) that represents (A-1), $R^1$ is preferably a methyl group, $R^3$ represents a vinyl group or allyl group, and X represents either a hydrogen atom, or an alkyl group of 1 to 6 carbon atoms, meaning OX represents an alkoxy group. Examples of the alkyl group of 1 to 6 carbon atoms include a methyl group, ethyl group, propyl group, butyl group, pentyl group or hexyl group, and a methyl group is preferred.

In the formula (1), if the value of b is less than the lower limit specified above, then the effect of the composition in preventing corrosion of the leads tends to be unsatisfactory, whereas if the value of b exceeds the upper limit specified above, then the thermal shock resistance of the cured product may deteriorate. If the value of c is less than the lower limit specified above, then the curability tends to be inadequate, whereas if the value of c exceeds the upper limit specified above, then the viscosity becomes difficult to regulate, which is undesirable. If the value of d exceeds the upper limit specified above, then the surface of the cured product tends to develop tackiness, which is undesirable.

Furthermore, the weight average molecular weight of this component (A-1), determined by gel permeation chromatography (GPC) and referenced against polystyrene standards, is typically within a range from 500 to 100,000, and in terms of the viscosity of the resulting composition, is preferably from 1,000 to 10,000.

An organopolysiloxane with this type of resin structure can be synthesized, for example, by combining the compounds that act as raw materials for each of the siloxane units constituting the organopolysiloxane in amounts that generate the desired molar ratio, and then performing a cohydrolysis condensation in the presence of an acid.

Examples of the raw materials for ($RSiO_{3/2}$) units, i.e., T units include chlorosilanes such as $MeSiCl_3$, $EtSiCl_3$, $PhSiCl_3$, propyltrichlorosilane and cyclohexyltrichlorosilane, and alkoxysilanes such as methoxysilanes that correspond with each of these chlorosilanes.

Further, examples of the raw materials for other units include chlorosilanes such as $Me_2ViSiCl$, $MeViSiCl_2$, $Ph_2ViSiCl$ and $PhViSiCl_2$, and alkoxysilanes such as methoxysilanes that correspond with each of these chlorosilanes.

Examples of the organopolysiloxane of the above formula (2) that represents the component (A-2) include the compounds shown below.

(In each of the above formulas, k and l each represents an integer of 0 to 1,000, provided that 10≦k+l≦1,000 and preferably 90≦k+l≦800, and provided that 0≦1/(k+l)≦0.5.)

The mass ratio between (A-1) and (A-2) is typically within a range from 20:80 to 80:20, and is preferably from 40:60 to 70:30.

The component (B) is a mixture of (B-1) a linear organohydrogenpolysiloxane represented by a formula (3) shown below, and (B-2) a branched organohydrogenpolysiloxane described below.

(wherein $R^7$ each independently represents a methyl group, ethyl group, propyl group, cyclohexyl group or phenyl group, p and q each represents an integer of 0 to 100, x and y each independently represents 0, 1, 2 or 3 provided that p+q is not less than 3, and x+y+p is an integer of 2 or more.)

The linear organohydrogenpolysiloxane has at least two, preferably at least three, and more preferably 3 to 10 silicon atom-bonded hydrogen atoms in each molecule. The number of the silicon atoms in a molecule (i.e., degree of polymerization) is preferably in a range from 5 to 500, and more preferably from 5 to 300. Examples of the linear organohydrogenpolysiloxane (B-1) include the compounds shown below.

(wherein n represents an integer of 1 to 100.)

(wherein m represents an integer of 1 to 100, and n represents an integer of 1 to 100.)

(wherein Ph represents a phenyl group)

The branched organohydrogenpolysiloxane (B-2) has at least one, and preferably 1 to 20 branches, and at least two, preferably at least 3, more preferably 3 to 10 silicon atom-bonded hydrogen atoms in each molecule. The branches are formed by the so-called T units and/or Q units. The structure of the entire molecule may be linear or cyclic ones with branches, or combinations thereof. The number of silicon atoms in a molecule (i.e., degree of polymerization) is preferably in a range from 3 to 100, more preferably from 3 to 10. Examples of the component (B-2) include the compounds shown below.

The mass ratio of (B-1) linear organohydrogenpolysiloxane/(B-2) branched organohydrogenpolysiloxane is typically within a range from 70/30 to 98/2, and is preferably from 90/10 to 97/3. If this ratio is too small, then the effect of the composition in preventing discoloration of the leads tends to be unsatisfactory, whereas if the ratio is too large, then the cured product may develop tackiness (stickiness).

The amount of the organohydrogenpolysiloxane to be blended is such that the molar ratio of the silicon atom-bonded hydrogen atoms contained therein to the aliphatic unsaturated groups contained in the component (A) is preferably in a range from 0.5 to 4.0, more preferably from 0.7 to 2.0.

The component (C) is a platinum group metal-based catalyst that is added to accelerate the addition curing reaction between the component (A) and the component (B). The catalyst of the component (C) is typically a platinum-based, palladium-based, or rhodium-based catalyst, and from the viewpoint of cost and the like, platinum-based catalysts of platinum, platinum black and chloroplatinic acid and the like are preferred. Specific examples include compounds such as $H_2PtCl_6 \cdot mH_2O$, $K_2PtCl_6$, $KHPtCl_6 \cdot mH_2O$, $K_2PtCl_4$, $K_2PtCl_4 \cdot mH_2O$ and $PtO_2 \cdot mH_2O$ (wherein, m represents an integer of 1 or greater), as well as complexes of these compounds with hydrocarbons such as olefins, alcohols, or vinyl group-containing organopolysiloxanes. These catalysts may be used either individually, or in combinations of two or more different catalysts.

The amount of the component (C) need only be sufficient to ensure effective curing, and a typical amount, calculated as a mass of the platinum group metal relative to the combined mass of the components (A) and (B), is within a range from 0.1 to 500 ppm, with an amount from 0.5 to 100 ppm being preferred.

Besides the components (A) to (C) described above, conventional additives such as inorganic fillers, adhesion aids and curing retarders may also be added to the composition in amounts that do not impair the effects of the present invention.

Examples of inorganic fillers that may be added include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide. These inorganic fillers may be added in a combined amount within a range from 0 to 600 parts by mass per 100 parts by mass of the combined mass of components (A) to (C).

In those cases where the cured product is required to exhibit favorable transparency, the use of a very fine silica such as Aerosil in an amount that does not impair the transparency is preferred. Inorganic fillers that exhibit the same refractive index as the cured silicone resin composition can be added for the purposes of improving the mechanical strength and modifying the coefficient of expansion.

Examples of adhesion aids that may be added include linear or cyclic organosiloxane oligomers of 4 to 50 silicon atoms, and preferably 4 to 20 silicon atoms, comprising at least two, and preferably either two or three, functional groups selected from the group consisting of a hydrogen atom bonded to a silicon atom (SiH group), an alkenyl group bonded to a silicon atom (such as a Si—CH=CH$_2$ group), an alkoxysilyl group (such as a trimethoxysilyl group) and an epoxy group (such as a glycidoxypropyl group or 3,4-epoxycyclohexylethyl group) within each molecule; and organooxysilyl-modified isocyanurate compounds represented by a general formula (4) shown below and/or hydrolysis-condensation products thereof (organosiloxane-modified isocyanurate compounds).

(4)

[wherein $R^8$ represents an organic group represented by a formula (5) shown below:

(5)

(wherein $R^9$ represents a hydrogen atom or a monovalent hydrocarbon group of 1 to 6 carbon atoms, and v represents an integer of 1 to 6, and preferably 1 to 4), or a monovalent hydrocarbon group comprising an aliphatic unsaturated bond, provided that at least one of the $R^8$ groups is an organic group of the formula (5).]

Examples of the monovalent hydrocarbon group comprising an aliphatic unsaturated bond include alkenyl groups of 2 to 8 carbon atoms, and preferably 2 to 6 carbon atoms, such as a vinyl group, allyl group, propenyl group, isopropenyl group, butenyl group, isobutenyl group, pentenyl group or hexenyl group, and cycloalkenyl groups of 6 to 8 carbon atoms such as a cyclohexenyl group. Furthermore, examples of the monovalent hydrocarbon group represented by $R^9$ in the formula (5) include monovalent hydrocarbon groups of 1 to 8 carbon atoms, and preferably 1 to 6 carbon atoms, including alkyl groups such as a methyl group, ethyl group, propyl group, isopropyl group, butyl group, isobutyl group, tert-butyl group, pentyl group, hexyl group or cyclohexyl group, the alkenyl groups and cycloalkenyl groups exemplified above for $R^8$, and aryl groups such as a phenyl group. Of these, an alkyl group is preferred.

Specific examples of the adhesion aid include 1-glycidoxypropyl-1,3,5,7-tetramethylcyclotetrasiloxane 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, and the compounds represented by the formulas shown below.

(wherein g and h each independently represents an integer of 0 to 100, provided that g+h is within a range from 2 to 50, and preferably from 4 to 20.)

Of the organosilicon compounds described above, organosilicon compounds having a silicon atom-bonded alkoxy group and an alkenyl group or silicon atom-bonded hydrogen atom (SiH group) within each molecule are preferred as they impart particularly superior adhesion to the resulting cured product.

The amount of the adhesion aid is typically not more than 10 parts by mass, preferably from 0.1 to 8 parts by mass, and more preferably from 0.2 to 5 parts by mass, per 100 parts by mass of the component (A). An amount that is too large can have adverse effects on the hardness of the cured product, and may also increase surface tackiness.

A curing retarder may be used to enable the composition to be stored favorably in a liquid state under normal temperature conditions. Examples of the curing retarder include organopolysiloxanes with a high vinyl group content such as tetramethyltetravinylcyclotetrasiloxane, triallyl isocyanurate, alkyl maleates, acetylene alcohols and silane-modified or siloxane-modified products thereof, hydroperoxides, tetramethylethylenediamine, benzotriazole, and mixtures of the above compounds. The curing retarder is typically added in an amount within a range from 0.001 to 1.0 parts by mass, and preferably from 0.005 to 0.5 parts by mass, per 100 parts by mass of the component (A).

The silicone resin composition is prepared by mixing the above components uniformly together. Typically, the component (A) and the component (B) are stored as two separate liquids to prevent curing from proceeding, with the two liquids then mixed and cured at the time of use. The composition may also be prepared as a one-pot composition by adding a small amount of a curing retarder. The composition can be prepared so as to undergo curing at room temperature, but usually, the composition is prepared so that curing at room temperature is inhibited by the curing retarder, with curing then being initiated almost immediately by applying heat when required.

This composition can be used to coat an optical semiconductor element by applying the composition using a dispenser or the like. Storing and using the composition as a two-pot composition offers improvements in handling, and can therefore improve the productivity. Mixing is conducted immediately prior to use, using a mixing device such as a mixer or screw mixer, with the resulting mixture then injected directly into the molding apparatus. Although there are no particular restrictions on the curing conditions, which may vary depending on the curability of the silicone resin composition, curing can usually be conducted by heating at a temperature of 40 to 180° C. for a period of approximately 30 seconds to 4 hours.

EXAMPLES

The present invention is described in more detail below on the basis of a series of examples.

Synthesis Example 1

Synthesis of Component (A-1)

A mixture containing 148.1 g (70 mol %) of phenyltrichlorosilane and 36.15 g (30 mol %) of dimethylvinylchlorosilane was added dropwise over a period of one hour to a stirred mixed solvent medium containing 250 g of water and 100 g of toluene that had been heated to 80° C. Following completion of the dropwise addition, the mixture was refluxed for 2 hours, yielding a toluene solution of a cohydrolysis condensation product. This solution was left to settle and cool to room temperature, and following removal of the water layer, the toluene layer was washed repeatedly with water until the wastewater became neutral. To the thus obtained organopolysiloxane toluene solution (organic layer 1) was added an amount of KOH equivalent to a 20-fold excess relative to the chlorine content, and the resulting mixture was refluxed for two hours. Following the reaction, the reaction mixture was neutralized with trimethylchlorosilane, and was then washed repeatedly with water until the toluene layer became neutral (organic layer 2). The organic layer 2 was dried over anhydrous sodium sulfate, and was then filtered to remove impurities. The toluene was then removed from the filtrate (under reduced pressure), yielding a solid resin (hereafter referred to as "resin (A-1a)").

Synthesis Example 2

Synthesis of Component (A-1)

A mixture containing 116.3 g (55 mol %) of phenyltriehlorosilane, 19.35 g (15 mol %) of dimethyldichlorosilane and 42.3 g (30 mol %) of methylvinyldichlorosilane was added dropwise over a period of one hour to a stirred mixed solvent medium containing 250 g of water and 100 g of toluene that had been heated to 80° C. Following completion of the dropwise addition, the mixture was refluxed for 2 hours, yielding a toluene solution of a cohydrolysis condensation product. This solution was left to settle and cool to room temperature, and following removal of the water layer, the toluene layer was washed repeatedly with water until the wastewater became neutral. To the thus obtained organopolysiloxane toluene solution (organic layer 1) was added an amount of KOH equivalent to a 20-fold excess relative to the chlorine content, and the resulting mixture was refluxed for two hours. Following the reaction, the reaction mixture was neutralized with trimethylchlorosilane, and was then washed repeatedly with water until the toluene layer became neutral (organic layer 2). The organic layer 2 was dried over anhydrous sodium sulfate, and was then filtered to remove impurities. The toluene was then removed from the filtrate (under reduced pressure), yielding a solid resin (hereafter referred to as "resin (A-1b)").

Synthesis Example 3

Synthesis of Adhesion Aid

A reaction vessel was charged with 67.7 g of 3-glycidoxypropyl-methyldimethoxysilane (KBM-402, manufactured by Shin-Etsu Chemical Co., Ltd.), 370 g of dimethoxydimethylsilane, 20 g of vinylmethyldimethoxysilane and 3,000 ml of isopropyl alcohol, 25 g of a 25% aqueous solution of tetramethylammonium hydroxide and 270 g of water were added, and the resulting mixture was stirred for 3 hours at room temperature. Following completion of the reaction, 1,000 ml of toluene was added to the reaction system, and the mixture was neutralized using an aqueous solution of sodium dihydrogen phosphate. Using a separating funnel, the residue was washed with hot water. The toluene was then removed under reduced pressure, yielding the target adhesion aid.

Comparative Example 1

23 g of the vinyl group-containing resin from Synthesis Example 2 (resin (A-1b)), 70 g of a linear vinylsiloxane represented by a formula (6) shown below and having a viscosity at 25° C. of 4,000 mPa·s, 11.8 g of an organohydrogensiloxane represented by a formula (7) shown below, 3 g of an organohydrogensiloxane represented by a formula (8) shown below, 0.2 g of the acetylene alcohol-based compound ethynylcyclohexanol as a reaction retarder, and 0.1 g of a solution of an octyl alcohol-modified chloroplatinic acid (a platinum catalyst) were mixed together thoroughly in a planetary mixer heated at 60° C., yielding a comparative composition 1. The comparative composition 1 was poured into a mold coated with Teflon (trademark) and having a depth of 2 mm, a length of 17 cm and a width of 13 cm, and cured at 150° C. for 4 hours to obtain a cured product. Incidentally, in the composition, the molar ratio of the silicon atom-bonded hydrogen atoms contained in the organohydrogenpolysiloxanes to the aliphatic unsaturated groups contained in the vinyl group-containing resin and the linear vinylsiloxane was 1.9.

Example 1

With the exceptions of changing the quantity of the resin (A-1b) to 31 g, the quantity of the linear vinylsiloxane represented by the above formula (6) to 36 g, and the quantity of the organohydrogensiloxane represented by the above formula (7) to 14.1 g, respectively, a composition 1 was obtained in the same manner as Comparative Example 1. The composition 1 was heated in the same manner as Comparative Example 1 to obtain a cured product. Incidentally, in the composition 1, the molar ratio of the silicon atom-bonded hydrogen atoms contained in the organohydrogenpolysiloxanes to the aliphatic unsaturated groups contained in the vinyl group-containing resin and the linear vinylsiloxane was 1.5.

Example 2

With the exceptions of using 100 g of the vinyl group-containing resin from Synthesis Example 1 (resin (A-1a)) in place of the resin (A-1b), and changing the quantity of the linear vinylsiloxane represented by the above formula (6) to 100 g, and the quantity of the organohydrogensiloxane represented by the above formula (7) to 79 g, respectively, a composition 2 was obtained in the same manner as Comparative Example 1. The composition 2 was heated in the same manner as Comparative Example 1 to obtain a cured product. Incidentally, in the composition, the molar ratio of the silicon atom-bonded hydrogen atoms contained in the organohydrogenpolysiloxanes to the aliphatic unsaturated groups contained in the vinyl group-containing resin and the linear vinylsiloxane was 2.4.

Example 3

With the exceptions of using 60 g of the resin (A-1a) in place of the resin (A-1b), and changing the quantity of the linear vinylsiloxane represented by the above formula (6) to 40 g, the quantity of the organohydrogensiloxane represented by the above formula (7) to 32.4 g, and the quantity of the organohydrogensiloxane represented by the above formula (8) to 2.3 g, respectively, a composition 3 was obtained in the same manner as Comparative Example 1. The composition 3 was heated in the same manner as Comparative Example 1 to obtain a cured product. Incidentally, in the composition, the molar ratio of the silicon atom-bonded hydrogen atoms contained in the organohydrogenpolysiloxanes to the aliphatic unsaturated groups contained in the vinyl group-containing resin and the linear vinylsiloxane was 1.7.

Example 4

With the exceptions of using 71.4 g of the resin (A-1a) in place of the resin (A-1b), and changing the quantity of the linear vinylsiloxane represented by the above formula (6) to 30 g, the quantity of the organohydrogensiloxane represented by the above formula (7) to 43.2 g, and the quantity of the organohydrogensiloxane represented by the above formula (8) to 1.5 g, respectively, a composition 4 was obtained in the same manner as Comparative Example 1. The composition 4 was heated in the same manner as Comparative Example 1 to obtain a cured product. Incidentally, in the composition, the molar ratio of the silicon atom-bonded hydrogen atoms contained in the organohydrogenpolysiloxanes to the aliphatic unsaturated groups contained in the vinyl group-containing resin and the linear vinylsiloxane was 2.0.

Example 5

With the exceptions of using 76.9 g of the resin (A-1a) in place of the resin (A-1b), and changing the quantity of the linear vinylsiloxane represented by the above formula (6) to 40 g, the quantity of the organohydrogensiloxane represented by the above formula (7) to 34.44 g, and the quantity of the organohydrogensiloxane represented by the above formula (8) to 1.5 g, respectively, a composition 5 was obtained in the same manner as Comparative Example 1. The composition 5 was heated in the same manner as Comparative Example 1 to obtain a cured product. Incidentally, in the composition, the molar ratio of the silicon atom-bonded hydrogen atoms contained in the organohydrogenpolysiloxanes to the aliphatic unsaturated groups contained in the vinyl group-containing resin and the linear vinylsiloxane was 1.5.

Comparative Example 2

With the exceptions of using 40.1 g of the resin (A-1a) in place of the resin (A-1b), and changing the quantity of the organohydrogensiloxane represented by the above formula (8) to 15.2, a comparative composition 2 was obtained in the same manner as Comparative Example 1. The comparative composition 2 was heated in the same manner as Comparative Example 1 to obtain a cured product. Incidentally, in the composition, the molar ratio of the silicon atom-bonded hydrogen atoms contained in the organohydrogenpolysiloxanes to the aliphatic unsaturated groups contained in the vinyl group-containing resin and the linear vinylsiloxane was 1.2.

The compositions and their cured products from the Examples and Comparative Examples were subjected to the measurements described below. The results are detailed in Table 2.

1) Composition Viscosity (25° C.)

The viscosity was measured using a BL-type rotational viscometer.

2) Cured Product Mechanical Properties

The tensile strength (0.2 mm thickness), hardness (measured using a type A spring tester), and elongation (0.2 mm thickness) were measured in accordance with JIS K 6301.

3) Measurement of T-Φ Unit Amount

Using a nuclear magnetic resonance apparatus (AVANCE 700, manufactured by Bruker Corporation), a solid $^{29}$Si-DD/MAS measurement was conducted by packing a sample of approximately 100 mg shaved off the cured product inside a rotor made of zirconia and having an external diameter of 4 mm, subsequently rotating the sample at 9,000 Hz while irradiating 30 degree pulses at intervals of 30 seconds, and accumulating the results of approximately 1,000 repetitions.

4) Semiconductor Device Reflow Test

A reflow test was conducted in which the semiconductor device was passed through a reflow oven and then inspected for the presence of cracks. For the semiconductor device package, a model number NSSW108 (manufactured by Nichia Corporation) was used. The optical semiconductor element was mounted to a lead frame inside the depression within the package using a die bonding agent, and was connected to the electrodes with wires. Each of the compositions was injected into the depression of one of these packages, and was then cured at 150° C. for 4 hours, thereby encapsulating the optical semiconductor element and the wires. Ten of the semiconductor devices thus obtained were passed through an IR reflow oven having a maximum temperature of 260° C., and were then inspected under an optical microscope at 10-fold magnification for the presence of cracks. In Table 2, the word "Pass" means no cracks were observed, whereas the word "Fail" indicates that cracks were observed.

5) Lead Discoloration Test 10 devices prepared in the same manner as that described in 4) above were stored for one month at 25° C. inside a sealed container within an atmosphere containing 0.1 ppm of $H_2S$ gas. Subsequently, the luminous intensity of each device was measured, and a luminous intensity retention ratio was determined relative to a luminous intensity of 100% immediately following device preparation. A higher retention ratio indicates less discoloration.

TABLE 2

| | Comparative Example 1 | Example 1 | Example 2 | Example 3 | Example 4 | Example 5 | Comparative Example 2 |
|---|---|---|---|---|---|---|---|
| Composition viscosity (25° C.) (Pa·s) | 7.4 | 8.0 | 3.0 | 2.8 | 2.3 | 14.8 | 4 |
| Hardness (Type A) | 48 | 67 | 48 | 39 | 55 | 52 | 58 |
| T-Φ unit amount (mol/100 g) | 0.109 | 0.145 | 0.216 | 0.269 | 0.294 | 0.334 | 0.381 |
| Elongation (%) | 70 | 60 | 40 | 60 | 45 | 80 | 25 |
| Tensile strength (MPa) | 1.2 | 2.2 | 1.1 | 1.0 | 2.5 | 3.0 | 1.1 |
| Lead discoloration test | 88 | 92 | 95 | 95 | 96 | 97 | 94 |
| Semiconductor device reflow test | Pass | Pass | Pass | Pass | Pass | Pass | Fail |

As is evident from Table 2, the devices of examples 1 to 5 comprising an encapsulating material containing a predetermined T-Φ unit amount exhibited a luminous intensity retention ratio exceeding 90%, suffered no cracking even when subjected to the reflow test, and also exhibited excellent gas barrier properties and reflow resistance. In contrast, the devices of Comparative Example 1, in which the T-Φ unit amount within the encapsulating material was too low, exhibited a lower luminous intensity retention ratio due to corrosion of the lead, and the devices of Comparative Example 2, in which the T-Φ unit amount within the encapsulating material was too high, developed cracks during the reflow test.

The optical semiconductor device according to the present invention can be used in all manner of applications that require favorable retention of the luminous intensity, including as the backlights within liquid crystal displays, mobile telephones and information terminals, and within LED displays and internal or external illumination devices. Further, the silicone resin encapsulating material used in the present invention can be used not only for light emitting elements such as LED and laser diodes, but also for encapsulating light receiving elements that require favorable suppression of corrosion, and semiconductor elements other than optical semiconductor elements, such as LSI or IC elements.

What is claimed is:

1. An optical semiconductor device, comprising an optical semiconductor element and a cured product of a silicone resin composition that encapsulates the optical semiconductor element, wherein the silicone resin composition comprises:
   (A) an aliphatic unsaturated group-containing organopolysiloxane comprising:
      (A-1) an aliphatic unsaturated group-containing silicone resin represented by an average composition formula (1) shown below:

$$R^1_a R^2_b R^3_c (OX)_d SiO_{(4-a-b-c-d)/2} \quad (1)$$

wherein each $R^1$ independently represents a methyl group, an ethyl group, a propyl group or a cyclohexyl group, $R^2$ represents a phenyl group, $R^3$ represents an aliphatic unsaturated group, X represents a hydrogen atom or an alkyl group of 1 to 6 carbon atoms, provided the OX group is bonded to the silicon atom via the oxygen atom, a represents a number from 0.4 to 1.6, b represents a number from 1.6 to 3.6, c represents a number from 0.4 to 0.8, and d represents a number from 0 to 0.05, provided that 0<a+b+c+d<4, and
      (A-2) a linear organopolysiloxane having an aliphatic unsaturated group at both terminals and having a viscosity at 25° C. within a range from 10 to 500,000 mPa·s, represented by a formula (2) shown below:

wherein $R^4$ and $R^5$ each independently represents a methyl group, ethyl group, propyl group, cyclohexyl group or phenyl group, $R^6$ represents a vinyl group or allyl group, k and l each represents an integer of 0 to 1,000, provided that k+l is within a range from 10 to 1,000 and (1/k+1)<0.5, and x represents an integer of 1 to 3;
   (B) an organohydrogenpolysiloxane comprising:
      (B-1) a linear organohydrogenpolysiloxane represented by a formula (3):

wherein $R^7$ each independently represents a methyl group, ethyl group, propyl group, cyclohexyl group or phenyl group, p and q each represents an integer of 0 to 100, x and y each independently represents 0, 1, 2 or 3, provided that p+q is not less than 3, and x+y+p is an integer of 2 or more, and
      (B-2) a branched organohydrogenpolysiloxane, and
   (C) a platinum group metal-based catalyst and
wherein an amount of (ΦSiO$_{3/2}$) units wherein Φ represents a phenyl group within the cured product, determined by solid $^{29}$Si-DD/MAS analysis, is within a range from 0.13 mol/100 g to 0.37 mol/100 g.

2. The optical semiconductor device according to claim 1, wherein the amount of (ΦSiO$_{3/2}$) units wherein Φ represents a phenyl group is within a range from 0.17 mol/100 g to 0.25 mol/100 g.

3. The optical semiconductor device according to claim 1, wherein the optical semiconductor element is a light emitting diode.

4. The optical semiconductor device according to claim 1, wherein the composition further comprises an adhesion aid.

* * * * *